United States Patent
Grass et al.

(10) Patent No.: US 8,993,459 B2
(45) Date of Patent: Mar. 31, 2015

(54) METHOD OF FORMING A MATERIAL LAYER IN A SEMICONDUCTOR STRUCTURE

(75) Inventors: Carsten Grass, Dresden (DE); Martin Trentzsch, Radebeul (DE); Boris Bayha, Dresden (DE); Peter Krottenthaler, Simbach (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 15 days.

(21) Appl. No.: 13/601,072

(22) Filed: Aug. 31, 2012

(65) Prior Publication Data
US 2014/0065808 A1 Mar. 6, 2014

(51) Int. Cl.
| | |
|---|---|
| *H01L 21/00* | (2006.01) |
| *H01L 21/02* | (2006.01) |
| *H01L 21/28* | (2006.01) |
| *H01L 29/10* | (2006.01) |
| *H01L 29/51* | (2006.01) |

(52) U.S. Cl.
CPC ........ *H01L 21/02164* (2013.01); *H01L 21/022* (2013.01); *H01L 21/02271* (2013.01); *H01L 21/02323* (2013.01); *H01L 21/0234* (2013.01); *H01L 21/28255* (2013.01); *H01L 29/1054* (2013.01); *H01L 29/513* (2013.01); *H01L 29/517* (2013.01)

USPC .......................................... 438/785; 438/763

(58) Field of Classification Search
USPC .................................. 438/758, 785
See application file for complete search history.

(56) References Cited

U.S. PATENT DOCUMENTS

| | | | | |
|---|---|---|---|---|
| 5,376,591 | A * | 12/1994 | Maeda et al. | 438/761 |
| 5,445,982 | A * | 8/1995 | Hwang | 438/591 |
| 6,410,461 | B1 * | 6/2002 | Gao et al. | 438/786 |
| 6,809,043 | B1 * | 10/2004 | Ngo et al. | 438/788 |
| 2004/0173854 | A1 | 9/2004 | Kwon et al. | 257/365 |
| 2006/0166447 | A1 * | 7/2006 | Doczy et al. | 438/287 |

OTHER PUBLICATIONS

Translation of Official Communication from German Patent Office for German Patent Application No. 10 2013 214 300.1 dated Oct. 22, 2014.

* cited by examiner

*Primary Examiner* — Richard Booth
(74) *Attorney, Agent, or Firm* — Amerson Law Firm, PLLC

(57) ABSTRACT

A method comprises depositing a first portion of a first material layer on a semiconductor structure. A first run of a post-treatment process is performed for modifying at least the first portion of the first material layer. After the first run of the post-treatment process, a second portion of the first material layer is deposited. The second portion is formed of substantially the same material as the first portion. After the deposition of the second portion of the first material layer, a second run of the post-treatment process is performed for modifying at least the second portion of the first material layer.

17 Claims, 5 Drawing Sheets

METHOD OF FORMING A MATERIAL LAYER IN A SEMICONDUCTOR STRUCTURE

BACKGROUND OF THE INVENTION

1. Field of the Invention

Generally, the present disclosure relates to the field of integrated circuits, and, more particularly, to the formation of a material on a semiconductor structure.

2. Description of the Related Art

Integrated circuits typically comprise a large number of circuit elements, which include, in particular, field effect transistors. In a field effect transistor, a gate electrode can be separated from a channel region by a gate insulation layer that provides an electrical insulation between the gate electrode and the channel region. Adjacent the channel region, a source region and a drain region are formed. The channel region, the source region and the drain region can be formed in semiconductor material, wherein the doping of the channel region is inverse to the doping of the source region and the drain region. Thus, there is a PN transition between the source region and the channel region, and between the channel region and the drain region.

Depending on an electric voltage applied to the gate electrode, the field effect transistor can be switched between an on-state, wherein there is a relatively high electrical conductance between the source region and the drain region, and an off-state, wherein there is a relatively low electrical conductance between the source region and the drain region. Depending on the doping of the channel region, one distinguishes between N-channel transistors, wherein the electrical conductance between the source region and the drain region in the on-state is provided substantially by electrons, and P-channel transistors, wherein the electrical conductance between the source region and the drain region is provided substantially by holes.

In the miniaturization of field effect transistors, specific issues may arise. These issues may include a lowering of the electrical conductance of the channel region. It has been proposed to provide a channel region comprising silicon/germanium for increasing the electrical conductance of the channel region. In particular, silicon/germanium can provide a greater mobility of holes, so that a silicon/germanium channel region can be particularly helpful for increasing the electrical conductance of the channel region of a P-channel transistor.

Further issues that may occur in the miniaturization of field effect transistors may include a dependence of the drive current of the transistor on channel length. The drive current is influenced by a capacity between the gate electrode and the channel region, which, in turn, depends on the thickness and the dielectric constant of the gate insulation layer.

Conventionally, the gate insulation layer has been formed from silicon dioxide. However, at the sizes of field effect transistors used in current integrated circuits, an extremely small thickness of a gate insulation layer formed from substantially pure silicon dioxide would be required for obtaining an appropriate drive current of the transistors. A very thin gate insulation layer, however, may have issues associated therewith, which include, in particular, leakage currents caused by tunneling of charge carriers through the gate insulation layer.

To avoid such issues, materials having a greater dielectric constant than silicon dioxide (denoted "high-k materials") can be used in the formation of the gate insulation layer. A relatively high dielectric constant of the gate insulation layer can increase the capacity between the gate electrode and the channel region compared to a gate insulation layer of the same thickness having a lower dielectric constant, so that a greater dielectric constant of the gate insulation layer can allow obtaining a relatively high capacity at a relatively large thickness of the gate insulation layer.

Gate insulation layers comprising a high-k material can include a relatively thin layer of silicon dioxide formed on the silicon/germanium or silicon channel region, and a layer of a high-k material formed on the silicon dioxide layer. The silicon dioxide layer can passivate the surface of the silicon/germanium or silicon channel region, and can reduce the level of interface states compared to a direct deposition of high-k material on the semiconductor material of the channel region.

Field effect transistors comprising gate insulation layers comprising a high-k material as described above, however, may have specific issues associated therewith.

At an interface between the silicon dioxide of the gate insulation layer and the channel region, gate oxide integrity (GOI) defects can occur, which include locations wherein there is a locally reduced breakthrough voltage of the gate insulation layer. GOI defects may increase the likelihood of failure mechanisms such as time dependent dielectric breakdown (TDDP), wherein a dielectric breakdown of the gate insulation layer occurs as a result of a long-time application of a relatively low electric field.

Issues that may occur in field effect transistors having a gate insulation layer comprising a high-k material as described above can also include bias temperature instability (BTI). BTI, which includes negative bias temperature instability (NBTI) in P-channel transistors and positive bias temperature instability (PBTI) in N-channel transistors, can lead to an alteration of the threshold voltage of the transistor over a period of time, which may adversely affect the functionality of an integrated circuit wherein the transistor is provided. Defects at the interface between the channel region and the gate insulation layer and/or defects within the gate insulation layer, in particular defects within a silicon dioxide layer in the gate insulation layer, may increase the likelihood of bias temperature instability occurring.

An increase of the thickness of the gate insulation layer and/or the thickness of a portion of the gate insulation layer comprising silicon dioxide may improve gate oxide integrity, in particular with respect to time dependent dielectric breakdown and bias temperature instability. However, an increase of the thickness of the gate insulation layer may adversely affect the capacity between the gate electrode and the channel region, and may lead to an increase of the threshold voltage of a field effect transistor. Thus, the performance of the field effect transistor may be adversely affected, and a violation of specification limits may occur. While some of these issues can be reduced by combining an increased thickness of the silicon dioxide in the gate insulation layer with a nitridation, the nitridation may be associated with a degradation of an integrated circuit device wherein the field effect transistor is provided, and may increase manufacturing costs.

In view of the situation described above, the present disclosure relates to manufacturing techniques that allow improving the quality of a gate insulation layer, in particular the quality of a silicon dioxide in a gate insulation layer that comprises a silicon dioxide layer in addition to a layer of a material having a greater dielectric constant than silicon dioxide, while avoiding or at least reducing the effects of one or more of the issues identified above.

Moreover, the present disclosure relates to manufacturing techniques that allow improving a quality of a material layer whose formation comprises a deposition process and a post-treatment process that is performed after the deposition process, in particular, a post-treatment process that is based on a diffusion of species through material deposited in the deposition process.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein comprises depositing a first portion of a first material layer on a semiconductor structure. A first run of a post-treatment process for modifying at least the first portion of the first material layer is performed. After the first run of the post-treatment process, a second portion of the first material layer is deposited. The second portion is formed of substantially the same material as the first portion. After the deposition of the second portion of the first material layer, a second run of the post-treatment process is performed for modifying at least the second portion of the first material layer.

An illustrative method of forming a field effect transistor disclosed herein comprises providing a semiconductor structure comprising a semiconductor material. A gate insulation layer is formed on the semiconductor material. Forming the gate insulation layer comprises performing a first run of a chemical vapor deposition process to deposit a first portion of a silicon dioxide layer on the semiconductor material. After the first run of the chemical vapor deposition process, a first run of a plasma oxidation process is performed. In the plasma oxidation process, a portion of the semiconductor material adjacent the first portion of the silicon dioxide layer is oxidized. After the first run of the plasma oxidation process, a second run of the chemical vapor deposition process is performed to deposit a second portion of the silicon dioxide layer on the first portion of the silicon dioxide layer. After the second run of the chemical vapor deposition process, a second run of the plasma oxidation process is performed. The method further comprises forming a gate electrode above the gate insulation layer.

BRIEF DESCRIPTION OF THE DRAWINGS

The disclosure may be understood by reference to the following description taken in conjunction with the accompanying drawings, in which like reference numerals identify like elements, and in which.

Figure 1A:
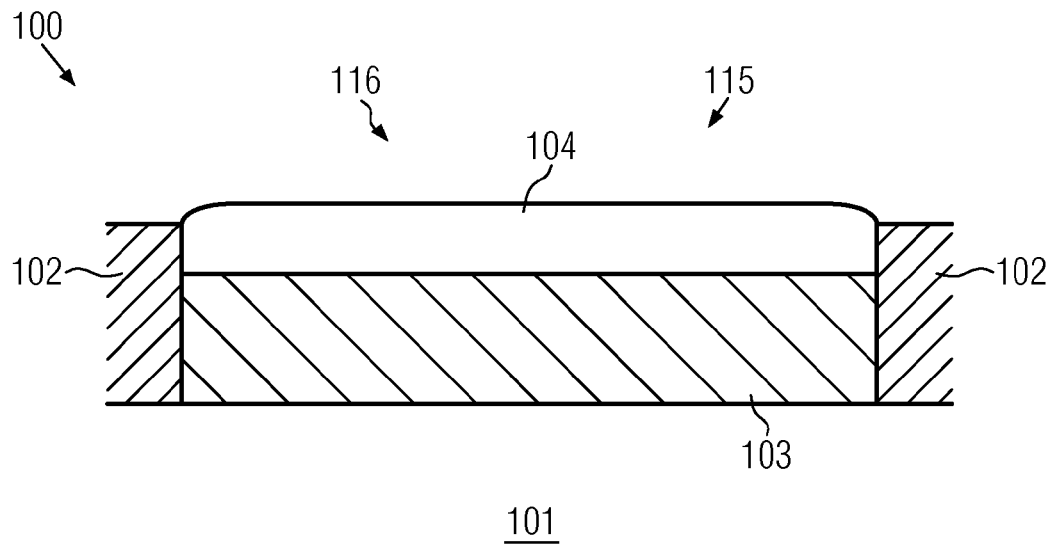
FIGS. 1a-1g show schematic cross-sectional views of a semiconductor structure during stages of a method according to an illustrative embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides methods wherein two or more portions of a material layer are deposited on a semiconductor structure. The portions of the material layer may be formed of substantially the same material. After the deposition of each portion of the material layer, a run of a post-treatment process may be performed. In each run of the post-treatment process, at least the portion of the material layer that was deposited before the respective run of the post-treatment process is modified.

In embodiments, each of the portions of the material layer may comprise silicon dioxide and may be deposited by means of a run of a chemical vapor deposition process. The chemical vapor deposition process may be a high temperature oxide process wherein silicon dioxide is created by a chemical reaction between silane and nitrous oxide at a deposition temperature in a range from about 650-850° C. The post-treatment process may comprise a plasma oxidation process, wherein the semiconductor structure is exposed to an oxidizing ambient created by an electric discharge, for example, a radio frequency electric discharge, in a gas comprising oxygen. The plasma oxidation process may be a decoupled oxidation process, and may be performed by means of a known decoupled plasma source. In each run of the plasma oxidation process, oxygen ions, atoms and/or molecules can react chemically with the silicon dioxide of the portion of the silicon dioxide layer that was deposited before the respective run of the post-treatment process. Thus, the deposited silicon dioxide can be densified, and open vacancies in the deposited silicon dioxide can be saturated, which may improve the quality of the silicon dioxide layer.

In embodiments, the method may be used for forming a silicon dioxide layer that is comprised in a gate insulation layer of a field effect transistor. In particular, the silicon dioxide layer may be provided between a channel region comprising silicon/germanium and/or silicon and a high-k material having a greater dielectric constant than silicon dioxide. In such embodiments, in the run of the post-treatment process that is performed after the deposition of the first portion of the silicon dioxide layer, a portion of the semiconductor material of the channel region adjacent the first portion of the silicon dioxide layer may be oxidized, so that a regrowth at the interface between the silicon dioxide and the silicon/germanium and/or the silicon can be obtained, in addition to a saturation of open vacancies in the silicon dioxide. For generating a defined regrowth, parameters of the plasma oxidation process, such as plasma power, the duration of the plasma oxidation process and the flow of gases, in particular oxygen flow, may be adapted accordingly.

In the run of the post-treatment process that is performed after the deposition of the second, third or any further portion of the silicon dioxide layer, the first portion and, optionally, other earlier deposited portions of the silicon dioxide layer may reduce a diffusion of oxygen toward the interface between the silicon/germanium and/or silicon semiconductor material and the silicon dioxide layer, which may limit the re-oxidation obtained. Thus, adverse effects of too much oxidation of semiconductor material at the interface, such as germanium pileup (in the case of a semiconductor material comprising germanium, such as silicon/germanium), a bad interface and/or a shift of the threshold voltage of the field effect transistor may be avoided or at least reduced. However, a densification of the deposited silicon dioxide and a saturation of open vacancies may be obtained in substantially the entire silicon dioxide layer, including the second, third or any further portion thereof.

Thus, a defined regrowth, a reduction of the amount of defects and/or a saturation of open vacancies may be obtained for a relatively broad range of final thicknesses of the silicon dioxide layer. This may allow improving the reliability of the gate insulation layer, in particular with respect to bias temperature instability and time dependent dielectric breakdown, can improve the performance of an integrated circuit comprising field effect transistors wherein the gate insulation layer is formed as described herein, and can reduce manufacturing costs.

The subject matter of the present disclosure is not limited to embodiments wherein a silicon dioxide layer is formed for providing a gate insulation layer. In other embodiments, methods as described herein may be used for forming silicon dioxide layers employed for other purposes than gate insulation.

Moreover, the subject matter of the present disclosure is not limited to embodiments wherein silicon dioxide is deposited by means of a chemical vapor deposition process and a plasma oxidation is performed as a post-treatment after the deposition of each portion of the silicon dioxide layer. Instead, methods as described herein may be applied to a number of post-treatments of a deposited layer, and may be particularly helpful when the post-treatment process is limited by diffusion through the deposit layer. Other materials than silicon dioxide may also be used.

FIG. 1a shows a schematic cross-sectional view of a semiconductor structure 100 in a first stage of a manufacturing process according to an embodiment. The semiconductor structure 100 comprises a substrate 101, above which a semiconductor layer 103 is formed. The substrate 101 may represent any appropriate carrier material, such as a semiconductor material, a semiconductor material in combination with an insulating material and the like.

In embodiments, the semiconductor material 103 in combination with the substrate 101 may form a silicon-on-insulator (SOI) configuration, wherein the semiconductor layer 103 is formed on an insulating surface portion of the substrate 101, for example on a portion of a surface of an insulating layer formed on a semiconductor wafer.

In other embodiments, the semiconductor layer 103 and the substrate 101 may form a bulk configuration, wherein the semiconductor layer 103 is formed on a substantially crystalline semiconductor material of the substrate 101, and/or wherein the semiconductor layer 103 and the substrate 101 are integral. The semiconductor layer 103 and/or and a semiconductor material in the substrate 101 may comprise silicon.

The semiconductor structure 100 further comprises an isolation structure 102, which may, in embodiments, be provided in the form of shallow trench isolations which separate a portion of the semiconductor layer 103 enclosed by the isolation structure 102 from other portions of the semiconductor layer 103 (not shown).

The semiconductor structure 100 further comprises a semiconductor layer 104 that may comprise a different semiconductor material than the semiconductor layer 103. In particular, the semiconductor layer 104 may comprise silicon/germanium and the semiconductor layer 103 may comprise silicon.

The portions of the semiconductor layers 103, 104 enclosed by the isolation structures 102 may form an active region 115 of a field effect transistor 116, and may comprise a specific well doping, the type of doping being selected in accordance with the type of the field effect transistor 116. For forming an N-channel field effect transistor, the portion of the layer 103 enclosed by the isolation structures 102 may be doped with a P-type dopant, and it may be doped with an N-type dopant if a P-channel field effect transistor is formed.

The present disclosure is not limited to embodiments wherein semiconductor layers 103, 104 formed of different materials are provided in the active region 115 of the field effect transistor 116. Alternatively, the active region 115 may comprise a single semiconductor material such as, for example, silicon.

In embodiments, the semiconductor structure 100 may comprise P-channel field effect transistors, wherein the active region comprises a silicon/germanium layer 104 formed above a silicon layer 103, as shown in FIG. 1a, and may additionally comprise N-channel field effect transistors wherein the entire active region is formed in a semiconductor layer that comprises silicon and/or is integral with a semiconductor substrate 101.

The semiconductor structure 100 may be manufactured as follows. The substrate 101 having the semiconductor layer 103 formed thereon may be provided by means of known processes. In embodiments wherein the semiconductor layer 103 and the substrate 101 form a silicon-on-insulator configuration, known methods of forming a silicon-on-insulator structure comprising a bonding of a semiconductor wafer to another semiconductor wafer having an insulating layer formed thereon, and cleaving one of the semiconductor wafers may be employed. In embodiments wherein the semiconductor layer 103 and the substrate 101 form a bulk configuration, the semiconductor layer 103 and the substrate 101 may be provided in the form of an integral semiconductor wafer.

The isolation structure 102 may be formed by using well-established methods of forming shallow trench isolation structures including lithography techniques, etch techniques, as well as deposition and planarization processes. In embodiments, the isolation structures 102 may comprise silicon dioxide, silicon nitride and the like.

The semiconductor layer 104 may be formed by means of well-established techniques for forming a semiconductor layer on a semiconductor structure, for example, a selective epitaxial growth process wherein silicon/germanium is selectively deposited on the surface on the semiconductor layer 103. Portions of the semiconductor structure 100 wherein no silicon/germanium layer is to be formed, for example portions of the semiconductor structure 100 wherein N-channel field effect transistors are formed, may be covered by a mask, the selective epitaxial growth process being adapted such that no deposition of silicon/germanium occurs on the mask. Thereafter, the mask may be removed by means of an etching process.

Figure 1B:
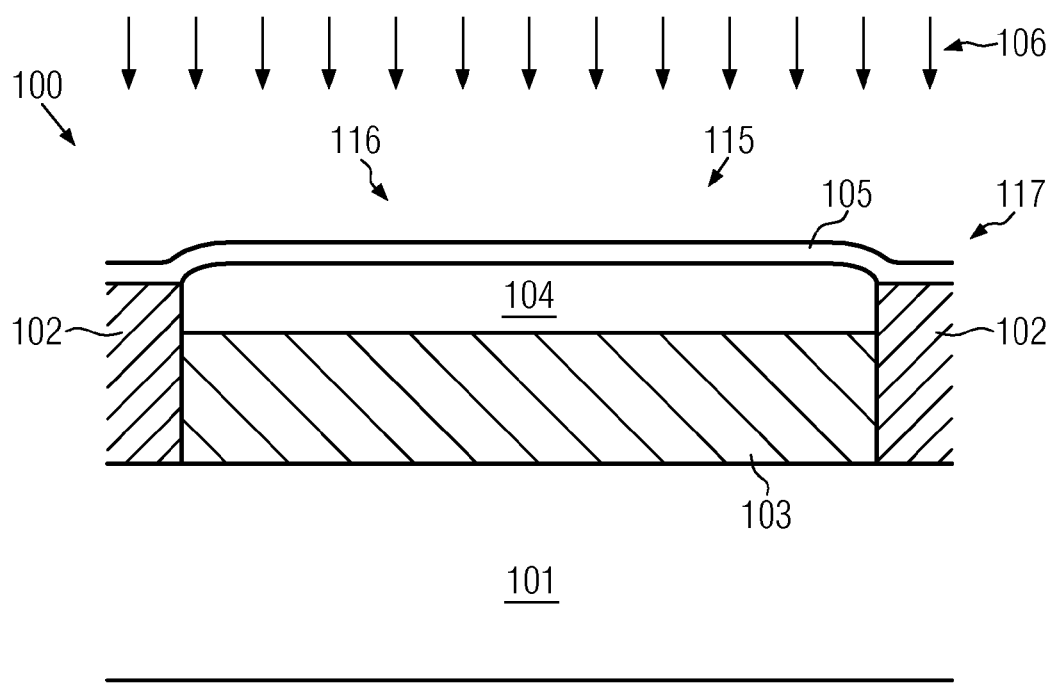

FIG. 1b shows a schematic cross-sectional view of the semiconductor structure 100 in a later stage of the manufacturing process. A first portion 105 of a material layer 117 may be deposited on the semiconductor structure 100. The first portion 105 of the material layer 117 may comprise silicon dioxide, and may be deposited on a surface of the semiconductor layer 104 by means of a run of a deposition process that is schematically denoted by arrows 106 in FIG. 1b. The deposition process may be a chemical vapor deposition process, wherein the semiconductor structure 100 is exposed to a reactant gas. At a surface of the semiconductor structure 100, components of the reactant gas react chemically with each other. In the chemical reaction, the material of the first portion 105 of the material layer 117 is formed.

In embodiments, the chemical vapor deposition process may be a high temperature oxide process, wherein the semiconductor structure 100 is exposed to a reactant gas comprising silane and nitrous oxide. The chemical vapor deposition process may be carried out at a relatively high temperature in a range from about 650-850° C. At the surface of the semiconductor structure 100, a chemical reaction between the silane and the nitrous oxide may occur, wherein silicon dioxide is formed. The silicon dioxide may be deposited on the semiconductor structure 100 to form the first portion 105 of the material layer 117.

The present disclosure is not limited to embodiments wherein a high temperature oxide process is performed for depositing the first portion 105 of the material layer 117. Alternatively, in embodiments wherein the material layer 117 comprises silicon dioxide, a low temperature oxide process, being a chemical vapor deposition process wherein the reactant gas comprises silane and oxygen, and the reaction is carried out at a temperature in a range from about 300-500° C., may be employed for providing the first portion 105 of the material layer 117.

In further embodiments, the first portion 105 of the material layer 117 may be formed from materials other than silicon dioxide, for example silicon nitride, and may be formed by performing a run of a known deposition process for depositing a silicon nitride layer.

Figure 1C:
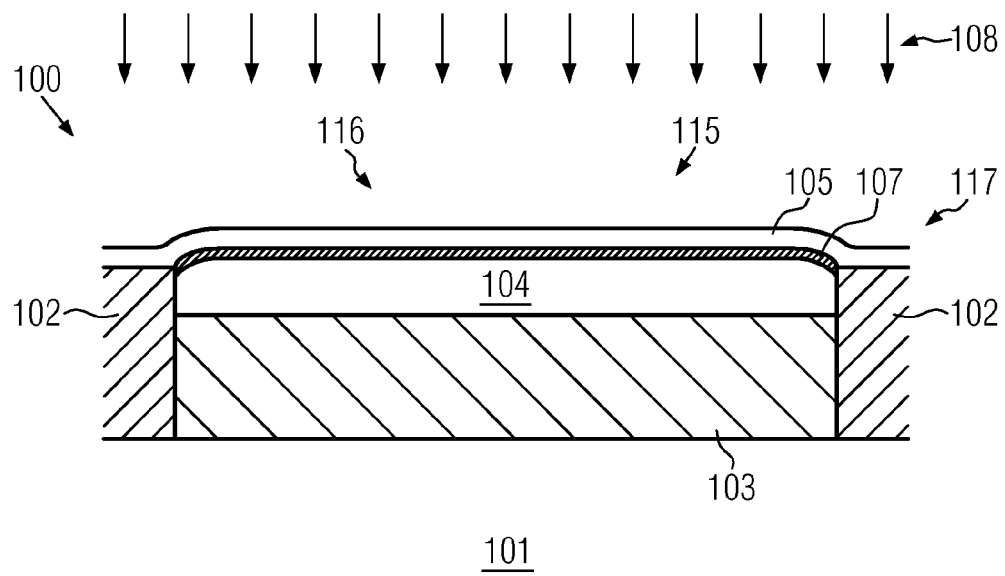

FIG. 1c shows a schematic cross-sectional view of the semiconductor structure 100 in a later stage of the manufacturing process. After the formation of the first portion 105 of the material layer 117, a run of a post-treatment process for modifying at least the first portion 105 of the material layer 117 may be carried out, as schematically denoted by arrows 108 in FIG. 1c.

The post-treatment process may comprise exposing the semiconductor structure 100 to a gas comprising one or more components that can react chemically with the material of the first portion 105 of the material layer and/or with the material of the semiconductor layer 104. In embodiments, the post-treatment process may comprise an oxidation process, wherein the semiconductor structure 100 is exposed to an oxidizing ambient, for example oxygen plasma.

The oxygen plasma may be provided by means of a known decoupled plasma source, wherein the semiconductor structure 100 is provided in a chamber comprising a gas comprising oxygen, for example, substantially pure oxygen, a mixture of oxygen and hydrogen, a mixture of oxygen and nitrogen and/or a mixture of oxygen and a noble gas, such as, for example, a mixture of oxygen and helium and/or argon, and an electric discharge is created in the gas comprising oxygen for at least partially ionizing the gas comprising oxygen. The electric discharge may be a radio frequency electric discharge, or it may be adapted for creating a microwave plasma. For creating the radio frequency electric discharge, the decoupled plasma source may comprise an inductive coil electrically connected to a first radio frequency power source, the inductive coil being provided above the semiconductor structure 100, and a second radio frequency power source electrically connected between a substrate holder on which the semiconductor structure 100 is provided and ground. The first and the second radio frequency source may operate at different frequencies.

Species such as oxygen atoms, ions and/or molecules from the oxygen plasma can react with the first portion 105 of the material layer 117. In embodiments wherein the first portion 105 of the material layer 117 comprises silicon dioxide, a reaction between the silicon dioxide of the first portion 105 of the material layer 117 and the species from the oxygen plasma can saturate open vacancies in the first portion 105 of the material layer 117, and can densify the first portion 105 of the material layer 117.

Additionally, oxygen atoms, ions and/or molecules from the oxygen plasma can diffuse through the first portion 105 of the material layer 117, and can react with the material of the semiconductor layer 104. In embodiments wherein the semiconductor layer 104 comprises silicon/germanium or silicon, oxygen from the oxygen plasma can react with silicon from the layer 104 to create silicon dioxide. Thus, an oxidized portion 107 of the semiconductor layer 104 may be formed adjacent the first portion 105 of the material layer 117. The formation of the oxidized portion 107 may improve a quality of an interface between the first portion 105 of the material layer 117 and the semiconductor layer 104. In particular, a density of defects at the interface may be reduced.

In the run 108 of the plasma oxidation process, parameters of the plasma oxidation process may be adapted such that a thickness of the oxidized portion 107 of the semiconductor layer 104 in a range from about 2-6 Å is obtained. Parameters of the plasma oxidation process may include, in particular, radio frequency power, time of the plasma oxidation process and flow of gases during the plasma oxidation process.

Figure 1D:
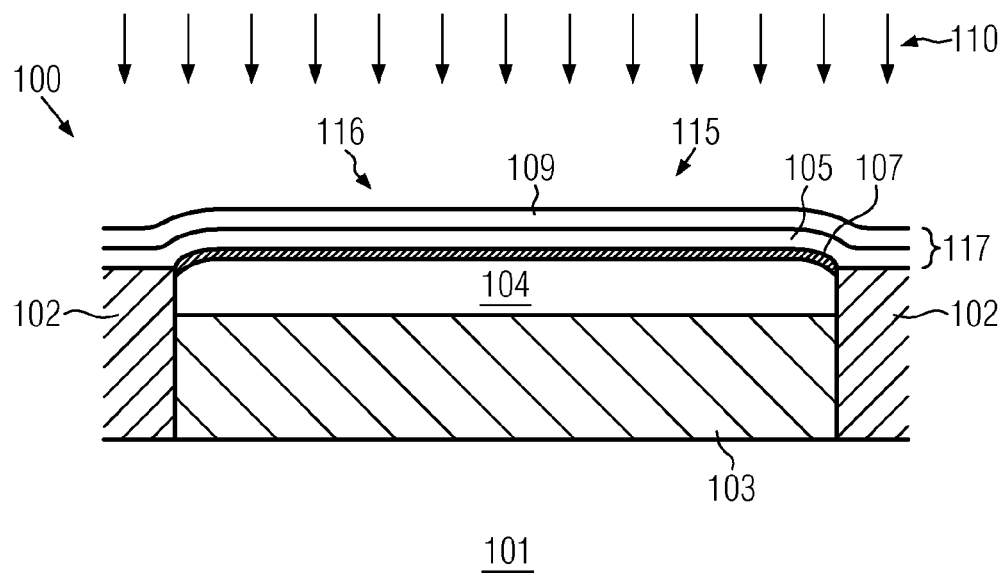

FIG. 1d shows a schematic cross-sectional view of the semiconductor structure 100 in a later stage of the manufacturing process. After the run 108 of the post-treatment process, a second portion 109 of the material layer 117 may be deposited. The second portion 109 of the material layer 117 may be formed of substantially the same material as the first portion 105. In particular, in embodiments wherein the first portion 105 of the material layer 117 comprises silicon dioxide, the second portion 109 of the material layer may also comprise silicon dioxide.

The second portion 109 of the material layer 117 may be formed by means of a run of a deposition process of the same type as the deposition process employed in the formation of the first portion 105 of the material layer 117, as schematically denoted by arrows 110 in FIG. 1d.

In the run 110 of the deposition process, at least some of the parameters of the deposition process may substantially correspond to parameters of the deposition process employed in the formation of the first portion 105 of the material layer 117. In particular, in embodiments wherein the deposition process used for the formation of the first portion 105 and the second portion 109 of the material layer 117 is a chemical vapor deposition process, parameters of the chemical vapor deposition process, such as a composition of the reactant gas, a flow of components of the reactant gas and temperature, may be substantially identical in the formation of the first portion 105 of the material layer and in the formation of the second portion 109 of the material layer.

However, a duration of the run 110 of the deposition process employed for the formation of the second portion 109 of the material layer 117 may be different from a duration of the run 106 of the deposition process employed for the formation of the first portion 105 of the material layer 117, so that the second portion 109 may have a different thickness than the first portion 105.

In particular, the run 110 of the deposition process may be carried out for a longer time than the run 106 of the deposition process, so that the second portion 109 of the material layer 117 has a greater thickness than the first portion 105, or the run 110 of the deposition process may be carried out for a shorter time than the run 106 of the deposition process, so that the second portion 109 is thinner than the first portion 105.

Alternatively, the durations of the runs 106, 110 of the deposition process may be substantially identical, so that the thickness of the first portion 105 of the material layer 117 is substantially identical to the thickness of the second portion 109 of the material layer 117.

Figure 1E:
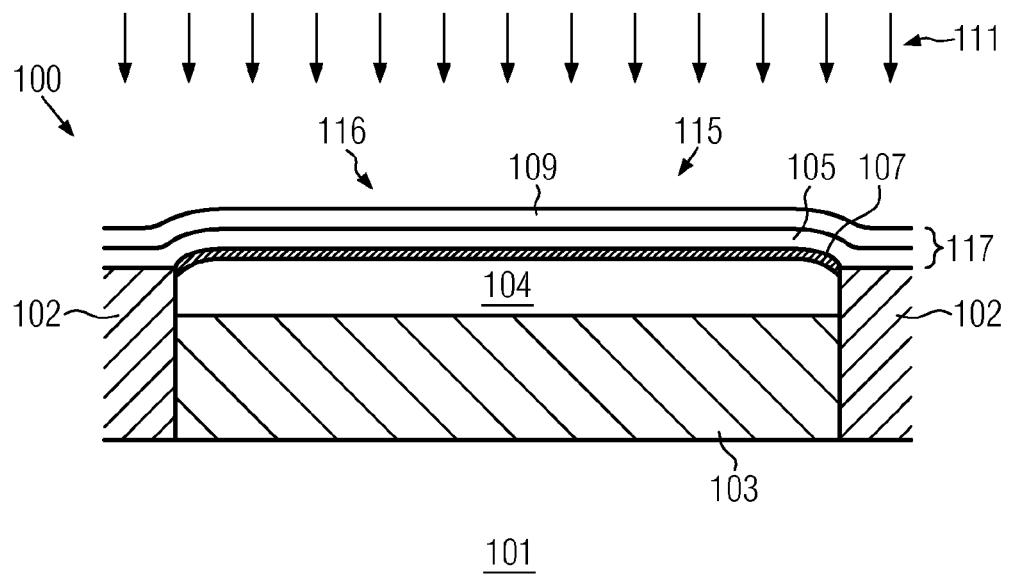

FIG. 1e shows a schematic cross-sectional view of the semiconductor structure 100 in a later stage of the manufacturing process. After the deposition of the second portion 109 of the material layer 117, a second run of the post-treatment process may be performed, as schematically indicated by arrows 111 in FIG. 1e. The post-treatment process performed after the deposition of the second portion 109 of the material layer 117 may be a post-treatment process of the same type as the post-treatment process performed after the deposition of the first portion 105 of the material layer 117. In embodiments, at least some of the parameters of the post-treatment process may be substantially identical in the runs 108, 111 of the post-treatment process.

In embodiments wherein the post-treatment process comprises exposing the semiconductor structure 100 to a plasma, for example an oxygen plasma, parameters of the plasma process, such as gas composition, pressure, temperature and gas flow(s), employed in the run 111 of the post-treatment process may substantially correspond to parameters of the run 108 of the post-treatment process performed after the formation of the first portion 105 of the material layer 117. Moreover, in embodiments, the duration of the run 111 of the post-treatment process may be substantially identical to a duration of the run 108 of the post-treatment process.

In other embodiments, at least one parameter of the post-treatment process may be different in the runs 108, 111 of the post-treatment process. For example, in embodiments wherein the second portion 109 of the material layer 117 has a greater thickness than the first portion 105, the run 111 of the post-treatment process may be performed for a longer time than the run 108 of the post-treatment process, and a duration of the run 111 of the post-treatment process may be shorter than a duration of the run 108 of the post-treatment process if the thickness of the second portion 109 of the material layer 117 is smaller than the thickness of the first portion 105.

Figure 1F:
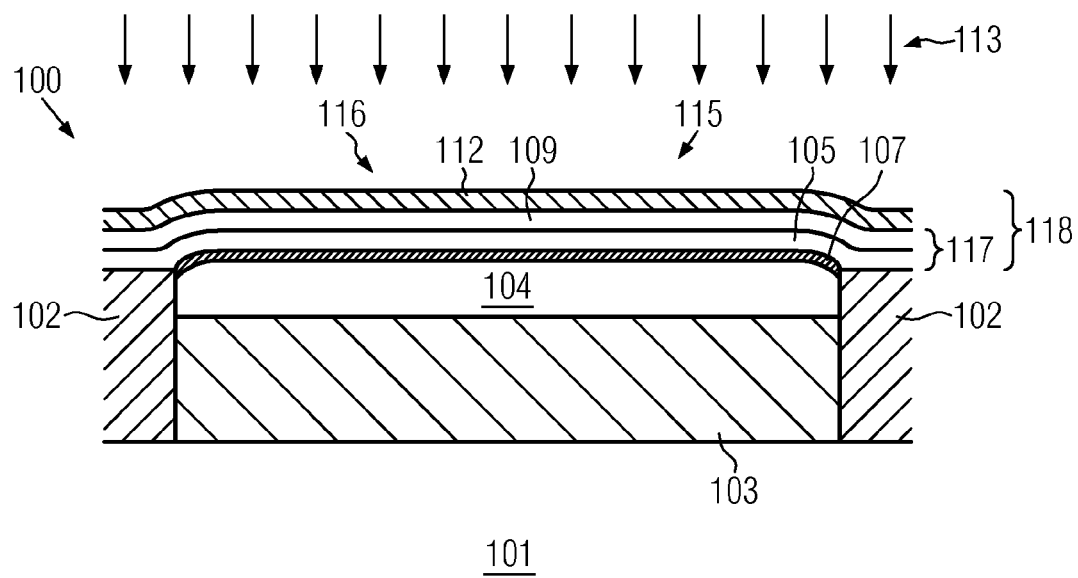

FIG. 1f shows a schematic cross-sectional view of the semiconductor structure 100 in a later stage of the manufacturing process. After the run 111 of the post-treatment process, a material layer 112 may be formed on the material layer 117. The material layer 112 may comprise a high-k material having a dielectric constant greater than the dielectric constant of silicon dioxide. In embodiments, the material of the material layer 112 may have a dielectric constant of about 10 or more. The material layer 112 may comprise hafnium oxide, zirconium oxide, hafnium silicate, zirconium silicate or another high-k material, or a mixture of one or more of such materials.

The material layer 112 may be formed by means of a deposition process schematically denoted by arrows 113 in FIG. 1f. The deposition process 113 may be a known process for the deposition of high-k materials, for example, chemical vapor deposition and/or atomic layer deposition.

The combination of the material layer 117 that may comprise silicon dioxide and the material layer 112 that may comprise a high-k material may form a gate insulation layer 118 of the field effect transistor 116. A total thickness of the gate insulation layer 118, being substantially equal to a sum of the thicknesses of the oxidized portion 107 of the semiconductor layer 104, the first portion 105 of the material layer 117, the second portion 109 of the material layer 117 and the material layer 112, may be greater than about 30 Å and/or may be in a range from about 30-80 Å. Such a relatively large thickness of the gate insulation layer 118 may help in reducing leakage currents in the field effect transistor 116.

Figure 1G:
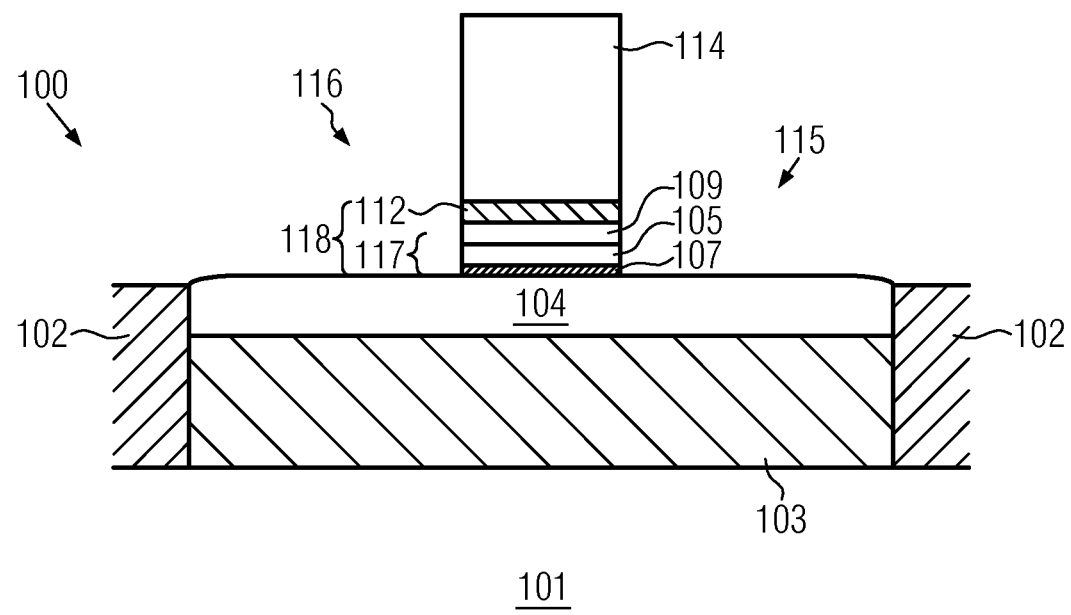

FIG. 1g shows a schematic cross-sectional view of the semiconductor structure 100 in a later stage of the manufacturing process. A gate electrode 114 may be formed over the second material layer 112, and portions of the oxidized portion 107 of the semiconductor layer 104, the material layer 117 and the material layer 112 which are not below the gate electrode 114 may be removed.

The formation of the gate electrode 114 may be performed by means of well-established techniques for forming a gate electrode of a field effect transistor. In embodiments, the gate electrode 114 may comprise one or more layers for adapting a work function of the gate electrode 114 to the gate insulation layer 118. These layers may be provided adjacent the second material layer 112. Moreover, in embodiments, the gate electrode 114 may be a metal gate electrode or a fully silicided gate electrode. In other embodiments, the gate electrode 114 may be a polysilicon gate electrode.

The formation of the field effect transistor 116 may further comprise forming doped source and drain regions (not shown) adjacent the gate electrode 114. The source and drain regions may be formed by means of known processes comprising a formation of spacers and/or ion implantation. The source and drain regions may be formed after the formation of the gate electrode 114 or before the formation of the gate electrode 114.

The subject matter of the present disclosure is not limited to embodiments wherein the material layer comprises only two portions, which are formed separately, and wherein two runs of a post-treatment process are performed. In other embodiments, a greater number of runs of a deposition process may be performed, each depositing a portion of a material layer, and a run of a post-treatment process may be performed after each run of the deposition process.

In the following, an illustrative example of an embodiment wherein three portions of a material layer are deposited, and a post-treatment process is performed after the deposition of each portion, will be described with reference to FIGS. 2a and 2b. For convenience, in FIGS. 1a-1g on the one hand, and FIGS. 2a-2b on the other hand, like reference numerals are used to denote like components, and elements shown in FIGS. 2a and 2b may have features corresponding to elements shown in FIGS. 1a-1g that are denoted by like reference numerals.

Figure 2A:
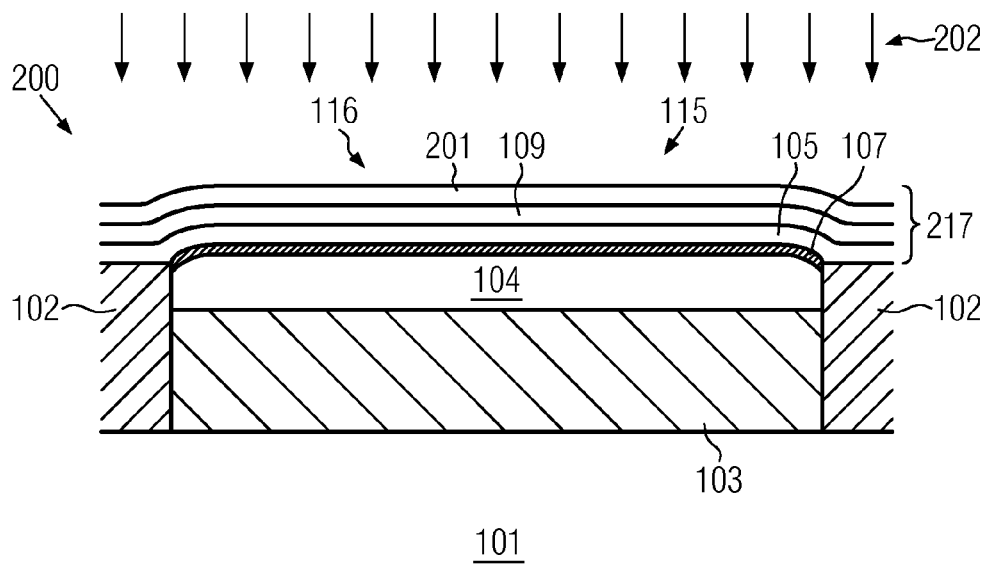
FIGS. 2a-2b show schematic cross-sectional views of a semiconductor structure in stages of a method according to an illustrative embodiment.

FIG. 2a shows a schematic cross-sectional view of a semiconductor structure 200 in a stage of a manufacturing process. The semiconductor structure 200 comprises a substrate 101, an insulation structure 102, layers 103, 104 of semiconductor material, a first portion 105 of a material layer 217, a second portion 109 of the material layer 217 that is formed from substantially the same material as the first portion 105, and an oxidized portion 107 of the layer 104 of semiconductor material that is provided between the first portion 105 of the material layer 217 and the layer 104 of semiconductor material.

These features of the semiconductor structure 200 may be formed as described above with reference to FIGS. 1a-1e. In particular, a first run of a deposition process may be performed for forming the first portion 105 of the material layer 217. Thereafter, a first run of a post-treatment process may be performed for modifying the first portion 105 of the material layer 217 and/or for forming the oxidized portion 107 of the layer 104 of semiconductor material. Thereafter, a second run of the deposition process may be performed for forming the second portion 109 of the material layer 217, and a second run of the post-treatment process may be performed for modifying the second portion 109 of the material layer 217.

After the second run of the post-treatment process, a third run of a deposition process, schematically denoted by arrows 202 in FIG. 2a, may be performed for forming a third portion 201 of the material layer 217. The run 202 of the deposition process used for forming the third portion 201 of the material layer 217 may have features substantially corresponding to those of the runs of the deposition process that are employed for forming the first portion 105 and the second portion 109 of the material layer 217.

In particular, the deposition process used for forming the third portion 201 may be a chemical vapor deposition process, wherein some or all of the parameters of the chemical vapor deposition process may be substantially identical to parameters of the chemical vapor deposition process used for depositing the first portion 105 and the second portion 109. A duration of the run of the deposition process employed for forming the third portion 201 of the material layer 217 may be longer or shorter than a duration of the runs of the deposition process used for forming the first portion 105 and/or the second portion 109 for increasing or reducing the thickness of the third portion 201 of the material layer 217 compared to thicknesses of the first portion 105 and the second portion 109 of the material layer 217. Alternatively, the duration of the run 202 of the deposition process employed for forming the third portion 201 of the material layer 217 may be substantially identical to the duration of the run of the deposition process for forming the first portion 105 of the material layer 217 and/or the run of the deposition process for forming the second portion 109 of the material layer 217.

Figure 2B:
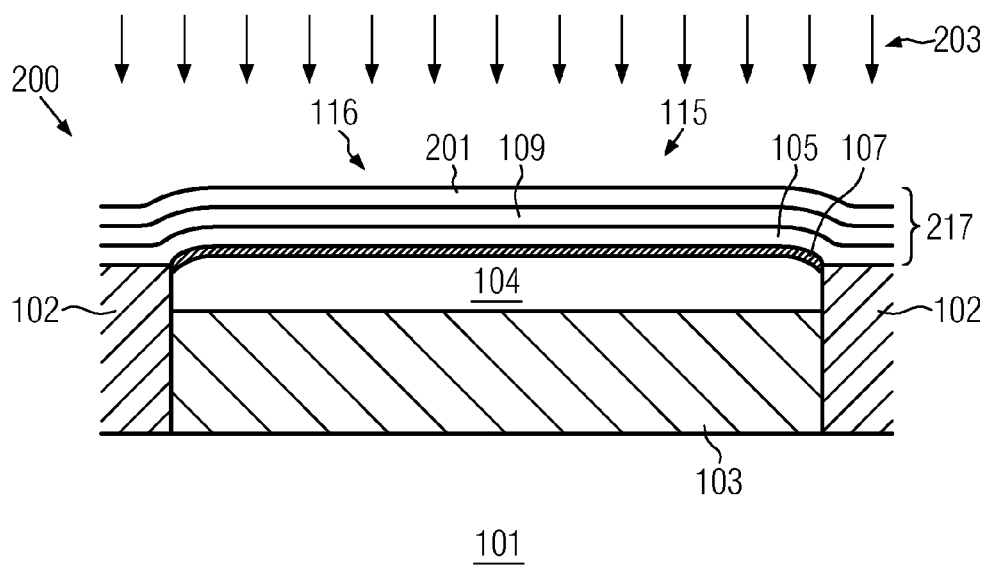

FIG. 2b shows a schematic cross-sectional view of the semiconductor structure 200 in a later stage of the manufacturing process. After the deposition of the third portion 201 of the material layer 217, a run of a post-treatment process may be performed, as schematically denoted by arrows 203 in FIG. 2b. Features of the run 203 of the post-treatment process may substantially correspond to those of post-treatment processes that are performed after the deposition of the first portion 105 of the material layer 217 and after the deposition of the second portion 109 of the material layer 217. In particular, in embodiments wherein the material layer 217 comprises silicon dioxide, the post-treatment process 203 may be a plasma oxidation process that may be carried out by means of a decoupled plasma source.

After the run 203 of the post-treatment process, a further material layer similar to the second material layer 112 described above with reference to FIG. 1f may be formed on the third portion 201 of the material layer 217 and/or a gate electrode similar to gate electrode 114 described above with reference to FIG. 1g may be formed over the second material layer 217. Alternatively, after the run 203 of the post-treatment process, a fourth portion of the material layer 217 may be formed on the third portion 201, and a post-treatment process for modifying the fourth portion may be carried out. Thereafter, further deposition processes and further post-treatment processes may optionally be carried out.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
depositing a first portion of a first material layer on a semiconductor structure;
performing a first run of a post-treatment process for modifying at least said first portion of said first material layer, wherein said post-treatment process comprises exposing said semiconductor structure to an oxidizing ambient, wherein a portion of said semiconductor structure adjacent said first material layer is oxidized during said first run of said post-treatment process;
after said first run of said post-treatment process, depositing a second portion of said first material layer, said second portion being formed of substantially the same material as said first portion;
after said deposition of said second portion of said first material layer, performing a second run of said post-treatment process for modifying at least said second portion of said first material layer; and
forming a gate electrode of a field effect transistor above said first material layer, said first material layer being located between a channel region of said field effect transistor and said gate electrode for providing electrical insulation between said gate electrode and said channel region.

2. The method of claim 1, further comprising, after said second run of said post-treatment process, depositing at least one further portion of said first material layer on said semiconductor structure, each further portion of said first material layer being formed of substantially the same material as said first and second portion of said first material layer and, after each deposition of one of the at least one further portion of said first material layer, performing a run of said post-treatment process.

3. The method of claim 1, wherein each of said deposition of said first portion of said first material layer and said deposition of said second portion of said first material layer comprises performing a run of a deposition process.

4. The method of claim 3, wherein said deposition process is a chemical vapor deposition process.

5. The method of claim 4, wherein a material of said first and second portion of said first material layer comprises silicon dioxide, and a reactant gas comprising silane and nitrous oxide is used in said chemical vapor deposition process.

6. The method of claim 4, wherein said post-treatment process comprises exposing said semiconductor structure to a plasma, wherein said plasma is formed by an electric discharge in a gas having a different composition than a reactant gas used in said chemical vapor deposition process.

7. The method of claim 6, wherein said plasma is formed by an electric discharge in a gas comprising oxygen.

8. The method of claim 7, wherein said plasma is formed by means of a decoupled plasma source.

9. The method of claim 1, further comprising forming a second material layer on said first material layer, said second material layer being formed of a material having a greater dielectric constant than a material of said first material layer.

10. The method of claim 9, wherein said material of said first material layer comprises silicon dioxide and said material of said second material layer has a dielectric constant of about 10 or more.

11. The method of claim 1, wherein said channel region comprises at least one of silicon and germanium.

12. The method of claim 1, wherein said oxidized portion adjacent said first material layer has a thickness in a range from about 2-6 Å.

13. The method of claim 9, wherein a total thickness of said first material layer and said second material layer is greater than about 30 Å.

14. The method of claim 9, wherein a total thickness of said first material layer and said second material layer is in a range from about 30-80 Å.

15. A method of forming a field effect transistor, comprising:

providing a semiconductor structure comprising a semiconductor material;

forming a gate insulation layer on said semiconductor material, wherein forming said gate insulation layer comprises:

performing a first run of a chemical vapor deposition process to deposit a first portion of a silicon dioxide layer on said semiconductor material;

after said first run of said chemical vapor deposition process, performing a first run of a plasma oxidation process wherein a portion of said semiconductor material adjacent said first portion of said silicon dioxide layer is oxidized;

after said first run of said plasma oxidation process, performing a second run of said chemical vapor deposition process to deposit a second portion of said silicon dioxide layer on said first portion of said silicon dioxide layer; and after said second run of said chemical vapor deposition process, performing a second run of said plasma oxidation process;

the method further comprising:

forming a gate electrode above said gate insulation layer.

16. The method of claim 15, wherein forming said gate insulation layer further comprises forming a layer of a material having a greater dielectric constant than silicon dioxide on said silicon dioxide layer.

17. The method of claim 16, wherein forming the gate insulation layer further comprises, after said second run of said plasma oxidation process, performing one or more runs of said chemical vapor deposition process to deposit one or more further portions of said silicon dioxide layer, wherein a run of said plasma oxidation process is performed after each run of said chemical vapor deposition process.

* * * * *